(12) United States Patent
Yamamoto et al.

(10) Patent No.: US 6,272,044 B2
(45) Date of Patent: *Aug. 7, 2001

(54) SEMICONDUCTOR STORAGE DEVICE AND METHOD OF DRIVING THEREOF

(75) Inventors: Hiroki Yamamoto; Yoshihiro Tada, both of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/425,196

(22) Filed: Oct. 22, 1999

(30) Foreign Application Priority Data

Oct. 26, 1998 (JP) .................................. 10-304555

(51) Int. Cl.[7] .................................... G11C 16/04
(52) U.S. Cl. .............................. 365/185.17; 365/185.05; 365/185.01
(58) Field of Search .................... 365/185.17, 185.05, 365/185.01

(56) References Cited

U.S. PATENT DOCUMENTS

| | | | | |
|---|---|---|---|---|
| 4,855,955 | * | 8/1989 | Cioaca | 365/185.17 |
| 5,621,689 | * | 4/1997 | Sakakibara et al. | 365/185.29 |
| 6,002,610 | * | 12/1999 | Cong et al. | 365/185.17 |

* cited by examiner

Primary Examiner—Huan Hoang
(74) Attorney, Agent, or Firm—Morgan, Lewis & Bockius LLP

(57) ABSTRACT

In a semiconductor storage device comprising a plurality of memory cells P formed in a matrix form in a semiconductor substrate, write and read for each of which is carried out through a word line and bit line, wherein each said memory cells includes a first and a second memory transistor MT1 and MT2 connected in series. In this configuration, the semiconductor storage device with high reliability which produces abnormality in operation can be provided.

9 Claims, 5 Drawing Sheets

FIG. 3 (a) DELETE
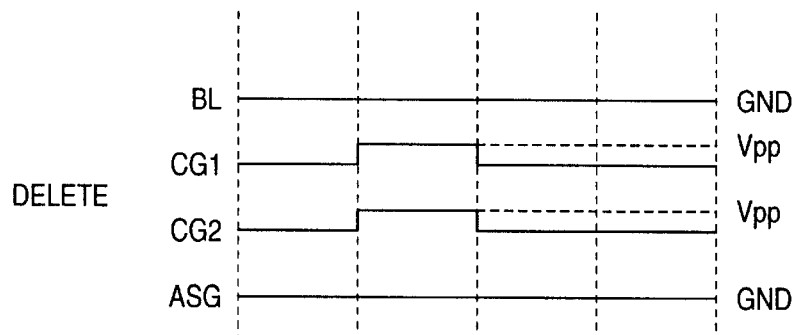
FIG. 3 (b) WRITE "0"
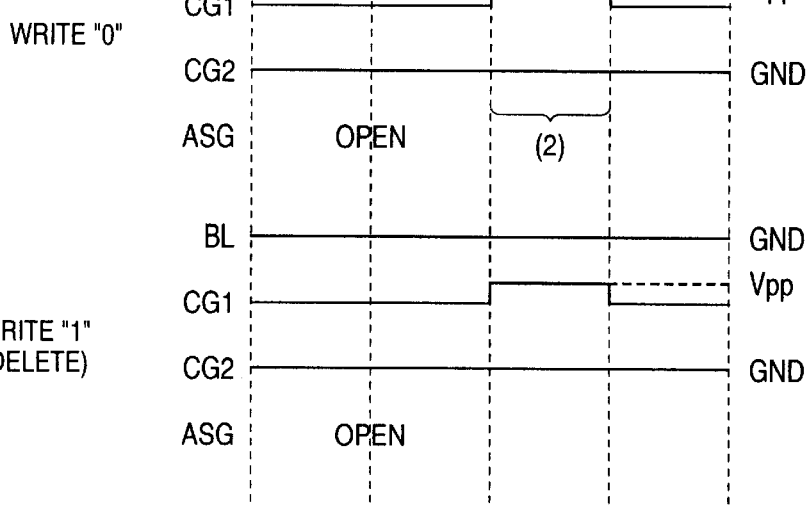
FIG. 3 (c) WRITE "1" (DELETE)
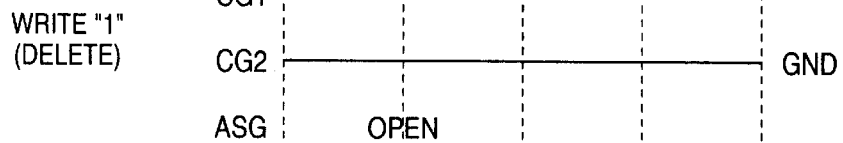
FIG. 3 (d) READ OUT
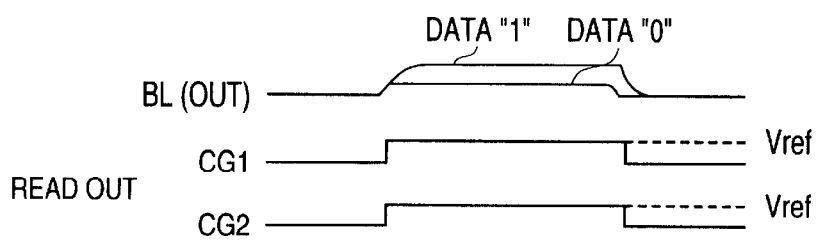

FIG. 6
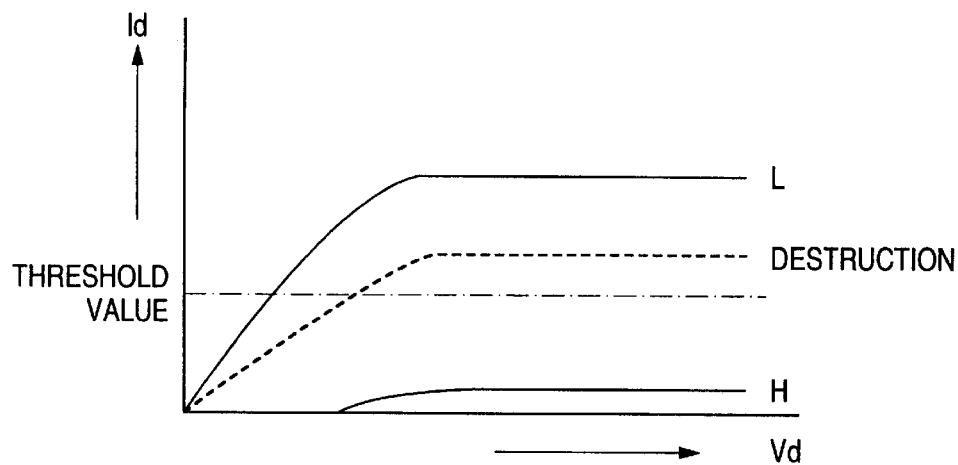
FIG. 7(a) DELETE
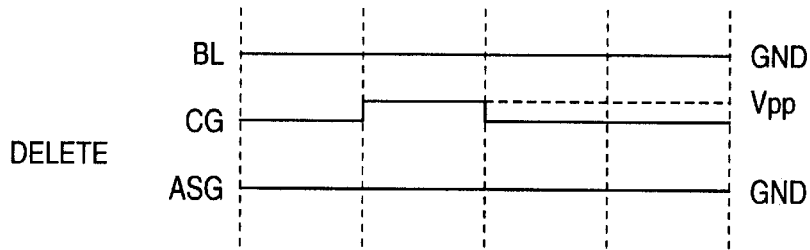
FIG. 7(b) WRITE "0"
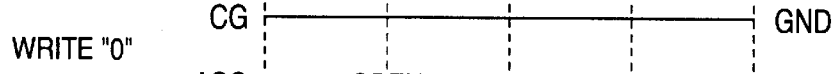
FIG. 7(c) WRITE "1"
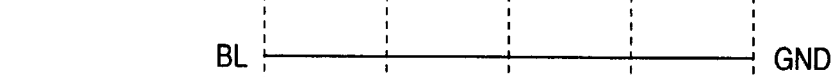
FIG. 7(d) READ OUT
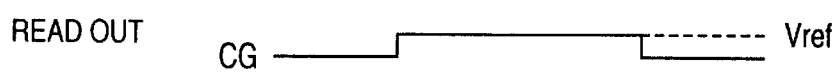

SEMICONDUCTOR STORAGE DEVICE AND METHOD OF DRIVING THEREOF

BACKGROUND OF THE INVENTION

1. Field of the Invention

The present invention relates to a semiconductor storage device. More particularly, the present invention relates to a semiconductor storage device which can continue to operate with no abnormality as a whole even in the failure of some memory transistors in a memory cell, in which information is written and read by applying and receiving electron through tunneling insulating film, such as EEPROM, flash memory, EPROM, FFRAM (memory using ferroelectric).

2. Description of the Related Art

The EEPROM is an example of a semiconductor storage device which can rewrite data electrically and hold it in a non-power supplied state. Such an EEPROM, as shown in FIG. 4, is structured so that memory cells, each composed of a pair of a memory transistor MT and a select transistor ST, are arranged in a matrix form in both vertical and horizontal directions. In this semiconductor storage device, the respective sources of the memory cells are coupled to provide a source line ASG (Array Source Ground). The drains of the memory cells arranged vertically are coupled to provide each bit line BL. The gate electrodes of select transistors ST arranged horizontally are coupled to provide each word line WLn. In order that some select transistors of the memory cells coupled vertically can be selected collectively, column lines COLn are provided. The outputs from the column lines are connected to data bus lines, respectively. Incidentally, Vsl serves to apply a reference voltage (sense voltage) Vref to the memory transistors.

The sectional structure of the memory cell is shown in FIG. 5. As seen from FIG. 5, a select transistor ST and a memory transistor MT are formed in a P-type semiconductor substrate. The select transistor is formed to have the following structure. A gate coupled with the word line WL is provided through a gate oxide film 5, and a N+ drain region 2 and an N+source region 3 are provided on both sides of the gate.

The memory transistor MT is formed to have the following structure. A floating gate 6 is formed through a gate oxide film 5 and a control gate CG is formed through an inter-layer insulating film 7. A drain region 3, which also serves as the source region of the above select transistor ST, and a source region 4 are provided on both sides of the control gate CG in a double-stage structure.

The gate oxide film 5 on the drain region 3 of the memory transistor MT has a partial tunnel window 5a so as to promote tunneling of electrons. The drain regions 2 of the select transistors ST of the memory cells arranged horizontally on the paper face are coupled to form a bit line BL. The gates of the select transistors of the memory cells arranged vertically to the paper face are coupled to form a word line WL. The source regions of the memory transistors MT are coupled to form an ASG.

The operation of this memory transistor is executed as follows. As seen from FIG. 6, in an erasure state H with data of "1", even when if a voltage Vd is applied between the source and drain, a drain current does not almost flow. On the other hand, in a write state L with data of "0", the drain current flows. Thus, the write state of the memory transistor can be discriminated from the erasure state.

Referring to FIG. 7, an explanation will be given of the relationship among applied voltages in the operation of erasure, write and read.

First, the erasing operation leading to the state of "1" will be carried out as follows. As seen from FIG. 7A, a pulse voltage waveform $V_{CG}$ of Vpp at a high potential is applied to the control gate of a memory transistor MT through a byte select transistor BST. A bit line BL and a source ASG are connected to earth GND. Thus, electrons are injected into the floating gate through a tunnel window 5a so that the memory transistor is placed into an erasure state.

The write operation leading to the state of "0" will be carried out as follows. As seen from FIG. 7B, the pulse voltage waveform $V_{CG}$ of Vpp at the high potential is applied to the bit line BL. The source line ASG is placed in an open state and the control gate CG of the memory transistor is connected to earth GND. Thus, electrons stored in the floating gate are drawn out so that the memory transistor is placed in the write state.

In order to write "1" (erase) in another column while "0" is written in the pertinent column, as seen from FIG. 7C, with the source line ASG and control gate CG placed in the same state as the state with "0" written, the bit line BL is connected to earth GND.

The read operation will be executed as follows. As seen from FIG. 7D, a reference voltage Vref is applied to the control gate CG and a prescribed potential is applied to the bit line BL. In this case, if the stored data is "1" (erasure state), as described above, the current does not almost flow. Therefore, the prescribed potential is outputted as it is and detected as data of "1". If the data is "0" (write state), as. described above, the current flows so that the voltage lowers to provide a low potential as seen from FIG. 7D. In this way, the erasure state and write state can be discriminated from each other.

Such a semiconductor storage device is composed of a large number of the above memory cells arranged in a matrix form. For example, EEPROM is composed of several thousands to several hundred thousands of memory cells. If any one of these memory cells suffers a failure, the entire semiconductor device does not operate normally. In order to repair such a partial failure at an initial stage of manufacturing the semiconductor storage device, a technique has been proposed which replaces a faulty memory cell by a normal memory cell for repair. Such a failure seldom occurs. However, if failure of a single memory cell occurs while the semiconductor storage device installed in a system operates normally, it cannot be repaired. Particularly, as described above, a semiconductor storage device is likely to produce dielectric breakdown in a tunnel window portion as described above. While it operates for a long time, it may produce dielectric breakdown. This attenuates the reliability of the semiconductor storage device.

For example, in the conventional EEPROM, a silicon oxide film having a thickness of 90 A or less was used as the gate insulating film. Therefore, while the EEPROM is used repetitively, it deteriorates during tunneling, leading to dielectric breakdown.

The present invention has been accomplished in order to solve the problems described above.

SUMMARY OF THE INVENTION

A first object of the present invention is to provide a reliable semiconductor storage device which can operate normally even when some transistors in memory cells suffer a failure. A second object of the present invention is to provide a method of driving such an improved semiconductor storage device.

In order to attain the first object, in accordance with the present invention, there is provided a semiconductor storage device comprising a plurality of memory cells formed in a matrix form in a semiconductor substrate, write and read for each of which is carried out through a word line and bit line, wherein each of the memory cells includes two memory transistors connected in series.

In this configuration, even if any one memory transistor produces any inconvenience such as dielectric breakdown, the memory transistor is short-circuited and the other memory transistor of the two memory transistors operates normally. This greatly improves the reliability of the semiconductor storage device.

Here, the series connection implies that the source of the one memory transistor is connected to the drain of the other transistor.

A first aspect of the device is a semiconductor storage device comprising a plurality of memory cells each having a select transistor and a memory transistor means, for each of which write and read for each of which is carried out in such a manner that a voltage is applied to a word line and bit line of the memory transistor means so that write and erasure of data is executed by tunnelling of electrons through a gate insulating film, wherein said memory transistor means comprises two memory transistors connected in series.

As described above, since the memory transistor means which is likely to produce dielectric breakdown during a long time use is composed of a plurality of transistors connected in series, even if a main one memory transistor for which write is done precedently deteriorates, the other memory transistor operates instantaneously as an auxiliary transistor. This permits the semiconductor storage device to continue a normal and reliable operation as a memory. Since these two memory transistors are connected in series and an amount of current is decreased, total assumption power is not increased.

A second aspect of the device is a semiconductor storage device according to the first aspect, wherein said memory cells comprises memory transistors arranged in a matrix form in a semiconductor substrate, each said memory cells having three transistors which are a series connection of a select transistor and a pair of memory transistors.

A third aspect of the device is a semiconductor storage device according to the second aspect, wherein each said memory transistors is an EEPROM comprising a floating gate formed on a surface of a semiconductor substrate through a tunneling insulating film, a control gate formed on said floating gate through a dielectric film, and a source and drain region formed in said semiconductor substrate.

A fourth aspect of the device is a semiconductor storage device according to the second aspect, wherein each said memory transistors is an FEPROM comprising a floating gate formed on a surface of a semiconductor substrate through a tunneling insulating film, a control gate formed on said floating gate through a dielectric film made of a ferroelectric film, and a source and drain region formed in said semiconductor substrate.

A fifth aspect of the device is a semiconductor storage device according to the first aspect, which comprises:

a plurality of memory cells arranged in a matrix form, each consisting of a series connection of a select transistor and source and drain regions of a first and a second memory transistor;

a plurality of word lines each connected to said select transistors of said memory cells arranged in a prescribed direction, control gates of said first memory transistors and said second memory transistors in parallel to said word line being connected to said word line through a first byte select transistor and a second byte select transistor;

a plurality of drain lines each connecting drains of drains of said select transistors in said memory cells arranged in a perpendicular to said prescribed direction; and a plurality of source lines each connecting sources of said second memory transistors in said memory cells.

A fifth aspect of the method is a method for driving a semiconductor storage device wherein a memory cell is composed of a series connection of a select transistor and source and drain regions of a first and a second memory transistor for which write and erasure of data are executed through tunneling of electrons through a gate insulating film, comprising the steps of:

applying a high potential to control gates of said first and said second memory transistor, respectively, to set said bit line and said source line at a low potential so that each memory cell at issue is placed in an erased state;

applying the high potential to said bit line to set the control gates of said first and said second memory transistor at the low potential so that data is written in said first memory transistor;

setting said bit line and the control gate of said first memory transistor at the high potential and setting the control gate of said second memory transistor at the low potential so that data is written in said second memory transistor; and applying a reference potential to the control gates of said first and said second memory transistor to produce an applied voltage to said bit line so that the data is read from the memory cell at issue.

A seventh aspect of the method is a method according to the sixth aspect, comprising a plurality of memory cells arranged in a matrix form, each said memory cells comprising three transistors connected in series, said three transistors consisting of a select transistor and a first and a second memory transistor, a source and a drain of each transistor being connected to the drain and source of an adjacent transistor; a plurality of word lines each connected to said select transistors of said memory cells arranged in a prescribed direction; a plurality of drain lines each connecting drains of drains of said select transistors in said memory cells arranged in a perpendicular to said prescribed direction; and a plurality of source lines each connecting sources of said second memory transistors in said memory cells, comprising the steps of:

applying a high potential to control gates of said first and said second memory transistor, respectively, to set said bit line and said source line at a low potential so that each memory cell at issue is placed in an erased state;

applying the high potential to said bit line to set the control gates of said first and said second memory transistor at the low potential so that data is written in said first memory transistor;

setting said bit line and the control gate of said first memory transistor at the high potential and setting the control gate of said second memory transistor at the low potential so that data is written in said second memory transistor; and applying a reference potential to the control gates of said first and said second memory transistor to produce an applied voltage to said bit line so that the data is read from the memory cell at issue.

An eighth method is a method according to the sixth aspect, wherein the reference potential to the control gates of said first and said second memory transistor is determined based on a current-voltage characteristic of a model cell in which one of said first and said second memory transistors is broken.

The semiconductor storage device according the present invention greatly reduces the molarity due to failure of the memory transistor during the operation by users (or consumers), thereby providing a semiconductor storage device with very high reliability.

The driving method according to the present invention permits the write for the two memory transistors connected in series to be simply made, so that the select transistor for the second memory transistor is not required. This contributes to miniaturization of the chip areas.

The above and other objects and features of the present invention will be more apparent from the following description taken in conjunction with the accompanying drawings.

BRIEF DESCRIPTION OF THE DRAWINGS

FIGS. 3(a) through 3(d) are timing charts for explaining the method of erasure, write and read in the semiconductor storage device in FIG. 1;

FIG. 6 is a graph for explaining the operation of a memory transistor shown in FIG. 4; and FIGS. 7(a) through 7(d) are timing charts for explaining the method of erasure, write and read in the EEPROM in FIG. 4.

DESCRIPTION OF THE PREFERRED EMBODIMENTS

Figure 1:
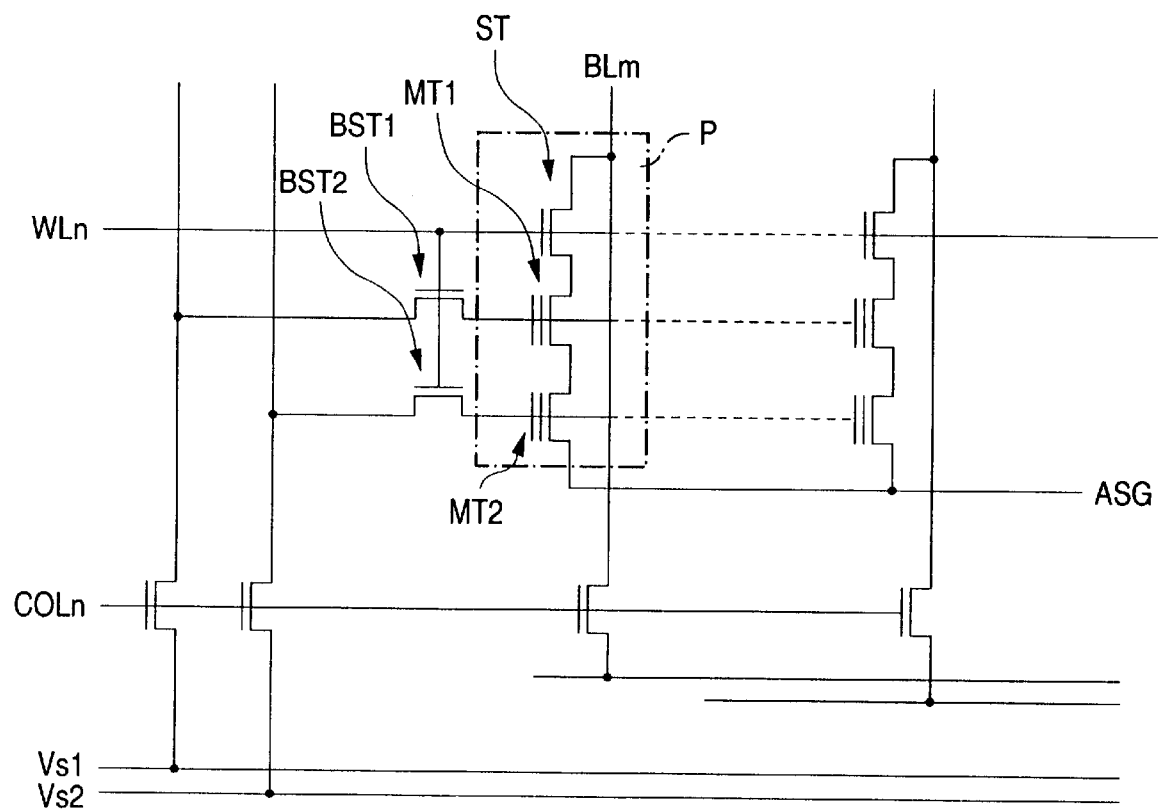
FIG. 1 is a circuit diagram of EEPROM according to one embodiment of the semiconductor storage device according to the present invention.

Now referring to the drawings, an explanation will be given of a semiconductor storage device according to the present invention and its driving method.

FIG. 1 is a circuit diagram of an embodiment of the semiconductor storage device according to the present invention. As seen from FIG. 1, the semiconductor storage device is composed of memory cells P each having a memory transistor MT formed in, a matrix in both vertical and horizontal directions on a semiconductor substrate, the read and write of which are executed through each word line Wn and each bit line Bm, wherein the memory transistor MT of each memory cell P includes a first memory transistor MT1 and a second memory transistor MT2 connected in series.

FIG. 1 shows the EEPROM having such a configuration. Specifically, in each memory cell, a memory transistor MT and a select transistor ST are connected in series. The gate electrodes of select transistors ST of the memory cells arranged horizontally are coupled to provide each word line WLn. The drains of the select transistors ST of the memory cells arranged vertically are coupled to provide each bit line BL. The respective sources of the memory transistors MT are coupled to provide a source line ASG (Array Source Ground). This embodiment is characterized in that each of the memory transistors MT consists of two memory transistors, i.e. the first memory transistor MT1 and the second memory transistor MT2. Specifically, the drain of the first memory transistor MT1 is connected to the source of the select transistor ST. The drain of the second memory transistor MT2 is connected to the source of the first memory transistor MT1. Further, the source of the second memory transistor is coupled with that in other memory cells to provide ASG.

As for the first memory transistors MT1, their control gates CG1 arranged horizontally, which are connected to one another (FIG. 2), are connected to the word line WLn through a first byte select transistor BST1. Likewise, as for the second memory transistors MT2, their control gates CG2 arranged horizontally, which are connected to one another (FIG. 2), are connected to the word line WLn through a second byte select transistor BST2.

In FIG. 1, COLn denotes a column line for selecting a column of the memory cells arranged vertically. In this example, this column line is designed to select six or eight columns collectively. The data of the selected columns are collectively transferred to a bus line. Further, in FIG. 1, Vs1 and Vs2 denote sense lines for applying a reference voltage Vref for read to the control gates CG1 and CG2 of the first and second memory transistors MT1 and MT2.

Figure 2:
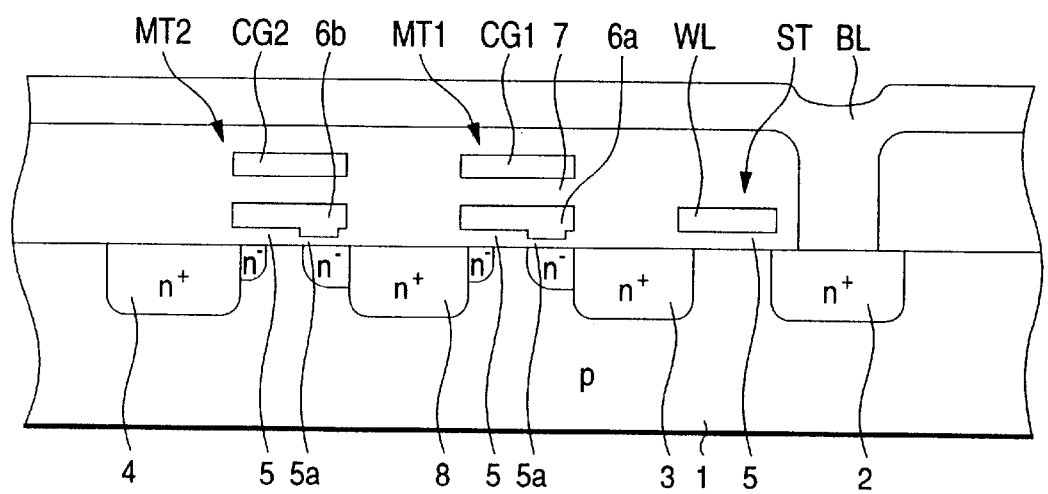
FIG. 2 is a sectional view of a semiconductor structure of a memory cell shown in FIG. 1.
Figure 4:
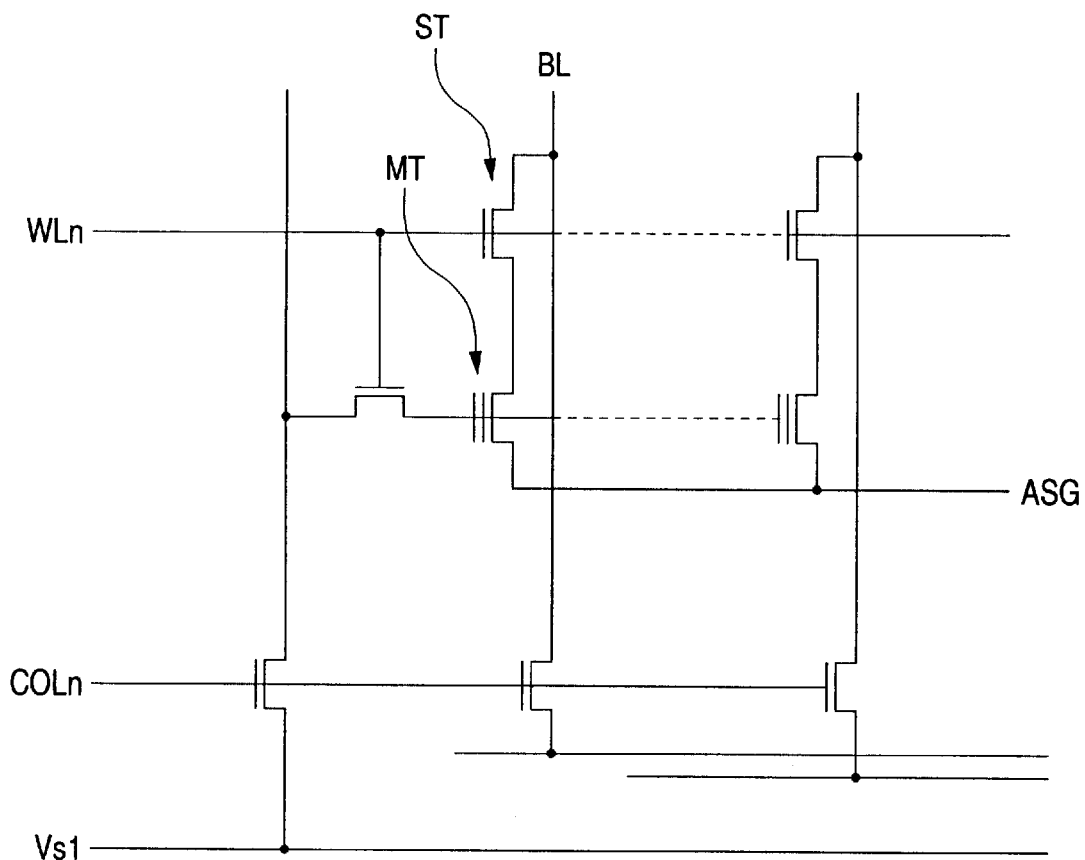
FIG. 4 is a circuit diagram of a conventional EEPROM.
Figure 5:
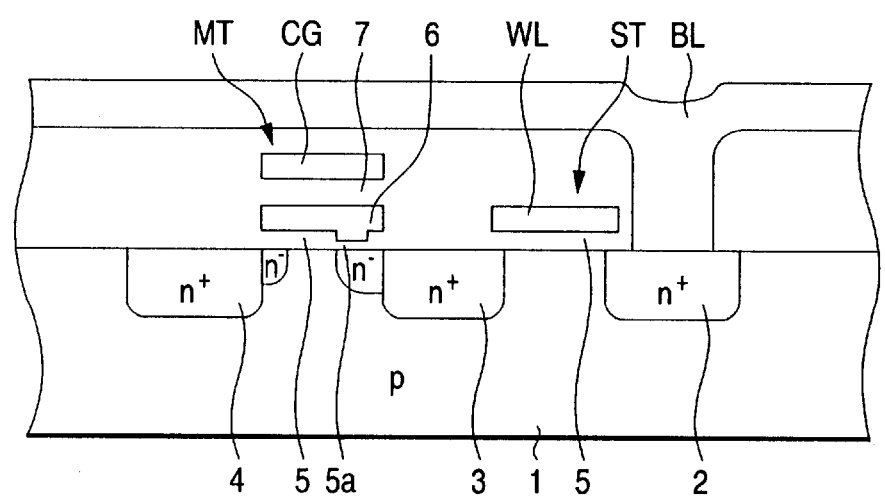
FIG. 5 is a sectional view of a semiconductor structure of a memory cell shown in FIG. 4.

FIG. 2 shows the semiconductor structure of a single memory cell P in the arrangement of FIG. 1. As seen from FIG. 2, the single memory cell in the semiconductor storage device according to the present invention is composed of a select transistor ST, a first memory transistor MT1 and a second memory transistor MT2.

Like the conventional structure, the select transistor ST is formed to have the following structure. A gate coupled with the word line WL is provided through a gate oxide film 5 on the surface of e.g. a p-type semiconductor substrate 1, and a N+ drain region 2 and a N+ source region 3 are provided on both sides of the gate.

The first memory transistor MT1 is formed to have the following structure. A floating gate 6a is formed through the gate oxide film 5 and a control gate CG1 is formed through an inter-layer insulating film 7. A drain region 3, which also serves as the source region of the above select transistor ST, and a source region 8 are provided on both sides of the control gate CG.

The second memory transistor MT2 is arranged adjacently to the first memory transistor MT1. The second memory transistor MT2 is formed to have the following structure. A floating gate 6b is formed through the gate oxide film 5 and a control gate CG2 is formed through an inter-layer insulating film 7. A drain region 8, which also serves as the source region 8 of the above first memory transistor MT1, and a source region 4 are provided on both sides of the control gate CG2. In this way, three transistors ST, MT1 and MT2 are formed. Incidentally, it should be noted that the drain/source regions 3, 8, and 4 of the memory transistors MT1 and MT2 are formed in an n-type double-stage structure, respectively.

The gate oxide film 5 on the drain regions 3 and 8 of the first memory transistor MT1 and MT2 has a partial tunnel window 5a so as to promote tunneling of electrons. The drain regions 2 of the select transistors ST of the memory cells arranged. horizontally on the paper face are coupled to form a bit line BL. The gates of the select transistors ST of the memory cells arranged vertically to the paper face are coupled to form a word line WL. The control gates CG1 of the first memory transistors arranged vertically to the paper face are coupled to one another. The control gates CG2 of the second memory transistors are also coupled to one another. The source regions 4 of the second memory transistors MT are coupled among the memory cells to form an ASG.

Referring to FIG. 3, an explanation will given of a method of driving the semiconductor storage device according to the present invention for its erasure, write and read. Incidentally, in the following explanation, the word "a high potential" refers to a potential providing a voltage of e. g. 12–20 V in a potential difference from a low potential (e.g. earth), which is a relative value to the low potential.

First, the erasing operation leading to the state of "1" will be carried out as follows. As seen from FIG. 3A, a pulse voltage waveform $V_{CG}$ of Vpp at the high potential is applied to the control gates CG1 and CG2 of the first and the second memory transistor MT1 and MT2 through the first and the second byte select transistor BST1 and BST2. The bit line BL and source ASG are connected to earth GND. Thus, electrons are injected into the floating gates 6a and 6b of the first and the second memory transistor through the tunnel window 5a so that the memory transistor is placed into an erasure state.

The write operation leading to the state of "0" will be carried out as follows. As a first step, as illustrated by the first half (1) in FIG. 3B, the pulse voltage waveform $V_{CG}$ of Vpp at the high potential is applied to the bit line BL. The source line ASG is placed in an open state and both the control gates CG1 and CG2 of the memory transistor are connected to earth GND. Thus, electrons stored in the floating gates are drawn out so that the first memory transistor is placed in the written state. In this case, a voltage drop occurs in the first memory transistor. Therefore, the high potential is not applied to the drain of the second memory transistor MT2 so that the write therefor is not made. In order to overcome such an inconvenience, as a second step, as seen from the second half (2) in FIG. 3B, with the pulse voltage waveform $V_{CG}$ of Vpp at the high potential being applied to the bit line BL, control gate CG2 of the second memory transistor being to connected to earth GND and source line ASG being placed in the open state, the pulse voltage waveform Vpp at the high potential is applied to the control gate CG1 of the first memory transistor MT1. At this time, the write has been already made for the first memory transistor MT1 so that the high potential has been applied to the control gate CG1 thereof. Therefore, the bit potential does not drop and is applied to the drain of the second memory transistor MT2. As a result, electrons stored in the floating gate of the second memory transistor MT2 are drawn out so that the second memory transistor is placed in the write state. Generally, where the two memory transistors are connected in series, the simultaneous write for both memory transistors cannot be executed. In order to realize this, two cells must be equipped with select transistors, respectively. On the other hand, in accordance with the present invention, the write for both memory transistors can be executed without providing the select transistors individually.

With the common word line being used, in order to maintain the erasure state at the bit lines other than the bit line to which "0" is written, "1" is written (erase) as follows. As seen from FIG. 3C, with the respective control gates CG1 and CG2 of the first and the second memory transistor MT1 and MT2 and the source line ASG being placed in the same state as the state with "0" written, the bit line BL is connected to earth GND.

The read operation will be executed as follows. As seen from FIG. 3D, a reference voltage Vref is applied to the control gates CG1 and CG2 and a prescribed potential is applied to the bit line BL. In this case, if the stored data is "1" (erasure state), as described above, the current does not almost flow. Therefore, the prescribed potential is outputted as it is and detected as data of "1". If the data is "0" (write state), as described above, the current flows so that the voltage lowers to provide a low potential as seen from FIG. 3D. In this way, the erasure state and write state can be discriminated from each other.

In accordance with the present invention, since the memory cell has two memory transistors connected in series, even if the one memory is broken, the other memory transistor permits the memory cell to continue a normal operation. Specifically, as shown in FIG. 6, where the single memory transistor is broken, a current larger than a threshold value flows even with "1" stored in the erasure state. Therefore, this state cannot be discriminated from the write state of "0" stored. In contrast, in accordance with the present invention, since two memory transistors are connected in series, even when the one memory transistor is broken and short-circuited, the other memory transistor operates normally. Therefore, with "1" stored, the current does not almost flow in both broken and non-broken memory transistors so that the state of "1" stored can be known surely.

On the other hand, with "0" stored, the current in the broken memory transistor flows as in the normal state, and also flows in the not-broken memory transistor so that the state of "0" stored can be known surely.

In other words, in order to the reliability of a semiconductor storage device, the present invention has been accomplished noting that when the memory transistor is broken, it is almost short-circuited. This reliability could be improved by connecting two memory transistors in series in a single memory cell. Specifically, except the infant mortality, the semiconductor storage device does not almost produce failure in a stable stage. However, in the semiconductor memory device, e. g. EEPROM, including several thousands to several hundred thousands of memory cells, only one thereof may suffer a failure accidentally. Such an accidental failure is really accidental (e.g. the breakdown of tunnel window described above), and both memory transistors in the same memory cell very seldom suffer a failure simultaneously. Therefore, even if any one of these memory transistors suffers a failure accidentally, the entire semiconductor device does not suffer a failure, but can operate normally. For this reason, the morality of about 100 ppm in the stable stage can be lowered to a fraction of several thousands of 0.1 ppm. Thus, the morality can be reduced in a degree of several orders of magnitude.

According to a driving method of the present invention, the write for the semiconductor memory device is made in two stages. Namely, after write has been made for the first memory transistor, using this write state, write for the second memory transistor is made. For this reason, write can be surely made for two memory transistors without increasing the number of select transistors. On the other hand, simultaneous erasure can be made for two memory transistors because both drain and source of the memory transistors is connected to earth GND. Further, during the read, with the reference voltage applied to both control gates of the two memory transistors, even if the one memory transistor is broken, the other memory transistor operate normally. Thus, the semiconductor storage device can continue its normal operation automatically.

Figure 8:
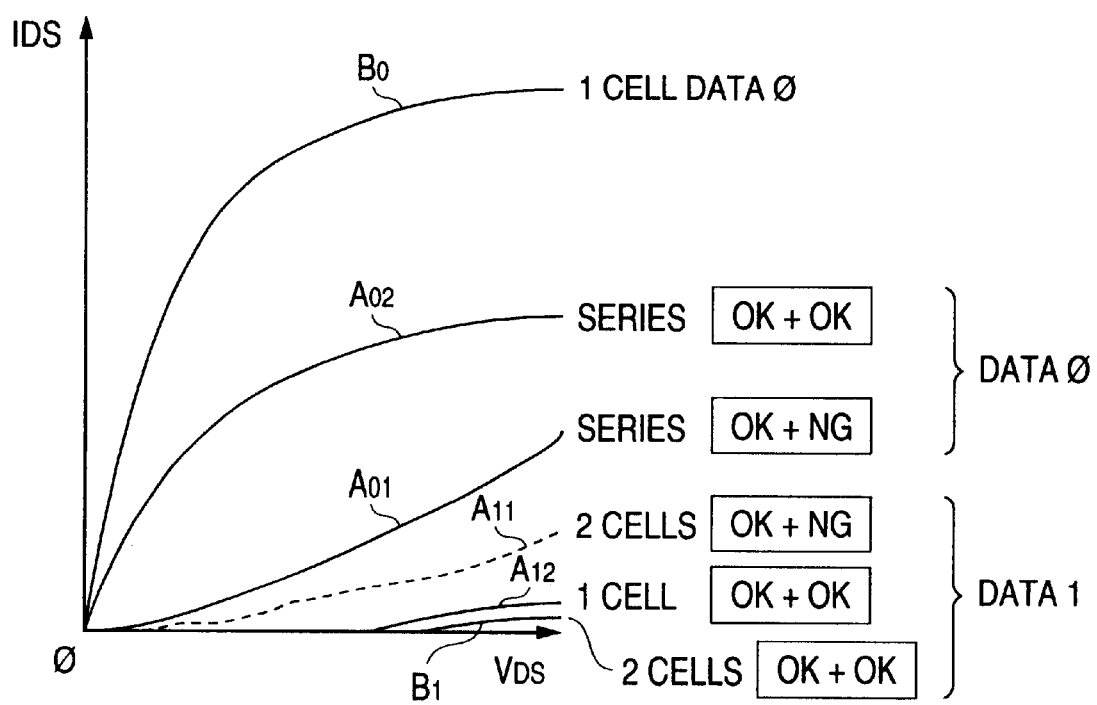
FIG. 8 is a diagram pertaining to a current deference (margin).

A current-voltage characteristics of a series connection of a pair of memory transistors in the device of the present invention, is shown as curves $A_{02}$–$A_{12}$, in FIG. 8. Curves $A_{02}$ shows a "0" written state of normal operation by both of memory transistors. Curves $A_{01}$ shows a "0" written state that the one memory transistor is broken. Curves $A_{12}$ shows a "1" written state of normal operation by both of memory transistors. Curves $A_{11}$ shows a "1" written state that the one memory transistor is broken. On the other hand, Curves $B_0B_1$ show a case of a conventional memory device consisting of one selective transistor and one memory transistor. Curves $B_0$ shows a "0" written state. Curves $B_1$ shows a "1" written state. According to comparing curves $A_{02}$–$A_{12}$ with curves $B_0B_1$, it is clearly known that the amount of current memory transistors of the present invention is reduced to half of that of the conventional device. Therefore power consumption is not risen.

However according to FIG. 8, it is known clearly that a current deference (margin) between a current of "0" written state and that of "1" written state, is very small. Therefore it is required that the voltage for reading out is controlled.

According to detecting current-voltage characteristics of a series connection of a pair of memory transistors in the device of the present invention, in which one memory transistor is broken, and determining the voltage for reading out based on the detected current-voltage characteristics, abnormal operation can be prevented.

Incidentally, the auxiliary memory transistor as well as the main memory transistor may be always subjected to erasure and write. However, in order to reduce power consumption, the driving circuit may be provided with a selecting means so that in a normal time, only the main transistor is driven and only when deterioration of the main transistor is detected, the auxiliary transistor may be driven by voltage application. This realizes a very efficient driving of the semiconductor storage device.

On the other hand, an increase in the number of memory transistors increases the area of a used chip. However, it is not required that the number of select transistors is increased, but only required that the area of the memory array (on which memory transistors are provided) is increased by a small rate of about 50–70%. Therefore, in accordance with the present invention, the reliability of the semiconductor memory device can be improved in a smaller area than the case of using two cells for the two memory transistors (chip area is increased about twice).

The present invention can be applied to not only EEPROM as described above, but also the other- semiconductor storage devices such as EPROM, flash memory and FFRAM having other memory structures. Namely, in these storage devices also, their reliability can be greatly improved in the stable state in such a manner that two memory transistors are connected in series in the same cell.

What is claimed is:

1. A semiconductor storage device comprising a plurality of memory cells each having a select transistor and a memory transistor means, for each of which write and read is carried out in such a manner that a voltage is applied to a word line and bit line of the memory transistor means so that write and erasure of data is executed by tunneling of electrons through a gate insulating film, wherein said memory transistor means comprises two memory transistors connected in series, one said memory transistor being a main memory transistor and the other said memory transistor being an auxiliary memory transistor, so that only during the period when said main memory transistor is broken, the semiconductor storage device is driven by said auxiliary memory transistor.

2. A semiconductor storage device according to claim 1, comprising:
a plurality of memory cells arranged in a matrix form, each consisting of a series connection of a select transistor and source and drain regions of a first and second memory transistor;
a plurality of word lines each connected to said select transistors of said memory cells arranged in a prescribed direction, control gates of said first memory transistors and said second memory transistors in parallel to said word line being connected to said word line through a first byte select transistor and a second byte select transistor;
a plurality of drain lines each connecting drains of said select transistors in said memory cells arranged in perpendicular to said prescribed direction; and
a plurality of source lines each connecting sources of said second memory transistors in said memory cells.

3. A semiconductor storage device according to claim 1, further comprising a selecting means for selecting one of the memory transistors so that in a normal time, only one of the two memory transistors is driven and only when deterioration of said main memory transistor is detected, said auxiliary memory transistor is driven by voltage application.

4. A semiconductor storage device according to claim 1, wherein said memory cells comprises memory transistors arranged in a matrix form in a semiconductor substrate, each said memory cells having three transistors which are a series connection of a select transistor and a pair of memory transistors.

5. A semiconductor storage device according to claim 4, wherein each said memory transistors is an EEPROM comprising a floating gate formed on a surface of the semiconductor substrate through a tunneling insulating film, a control gate formed on said floating gate through a dielectric film, and a source and drain region formed in said semiconductor substrate.

6. A semiconductor storage device according to claim 4, wherein each said memory transistors is an EEPROM comprising a floating gate formed on a surface of the semiconductor substrate through a tunneling insulating film, a control gate formed on said floating gate through a dielectric film made of a ferroelectric film, and a source and drain region formed in said semiconductor substrate.

7. A method for driving a semiconductor storage device wherein a memory cell comprises a series connection of a select transistor and source and drain regions of a first and a second memory transistor for which write and erasure of data are executed through tunneling of electrons through a gate insulating film, said first memory transistor being a main memory transistor and said second memory transistor being an auxiliary memory transistor, comprising the steps of:
applying a high potential to control gates of said first and said second memory transistors, respectively, to set said bit line and said source line at a low potential so that each memory cell at issue is placed in an erased state;
applying the high potential to said bit line to set the control gates of said first and said second memory transistors at the low potential so that data is written in said first memory transistor;
setting said bit line and the control gate of said first memory transistor at the high potential and setting the control gate of said second memory transistor at the low potential so that data is written in said second memory transistor; and applying a reference potential to the control gates of said first and said second memory transistor to produce an applied voltage to said bit line so that the data is read from the memory cell at issue, wherein only during the period when said main memory transistor is broken, the semiconductor storage device is driven by said auxiliary memory transistor.

8. A method for driving a semiconductor storage device according to claim 7, comprising a plurality of memory cells arranged in a matrix form, each said memory cells including three transistors connected in series, said three transistors consisting of a select transistor and a first and a second memory transistor, a source and a drain of each transistor being connected to the drain and source of an adjacent transistor; a plurality of word lines each connected to said select transistors of said memory cells arranged in a prescribed direction; a plurality of drain lines each connecting drains of said select transistors in said memory cells arranged in a perpendicular to said prescribed direction; and a plurality of source lines each connecting sources of said second memory transistors in said memory cells, comprising the steps of:

applying a high potential to control gates of said first and said second memory transistor, respectively, to set said bit line and said source line at a low potential so that each memory cell at issue is placed in an erased state;

applying the high potential to said bit line to set the control gates of said first and said second memory transistor. at the low potential so that data is written in said first memory transistor;

setting said bit line and the control gate of said first memory transistor at the high potential and setting the control gate of said second memory transistor at the low potential so that data is written in said second memory transistor; and applying a reference potential to the control gates of said first and said second memory transistor to produce an applied voltage to said bit line so that the data is read from the memory cell at issue.

9. A method for driving a semiconductor storage device according to claim 7, wherein the reference potential to the control gates of said first and said second memory transistor is determined based on a current-voltage characteristic of a model cell in which one of said first and said second memory transistors is broken.

* * * * *